US012696433B2

(12) United States Patent (10) Patent No.: US 12,696,433 B2
Choi et al. (45) Date of Patent: Jul. 28, 2026

(54) ELECTRONIC DEVICE

(71) Applicant: Samsung Display Co., Ltd., Yongin-si (KR)

(72) Inventors: Jangun Choi, Seoul (KR); Wee-Joon Jeong, Seongnam-si (KR); Yongil Kim, Suwon-si (KR); Byoungkyoo Park, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 343 days.

(21) Appl. No.: 17/874,634

(22) Filed: Jul. 27, 2022

(65) Prior Publication Data

US 2023/0072160 A1 Mar. 9, 2023

(30) Foreign Application Priority Data

Sep. 1, 2021 (KR) ........................ 10-2021-0116570

(51) Int. Cl.
H05K 7/20 (2006.01)
G02F 1/1333 (2006.01)
(52) U.S. Cl.
CPC ... H05K 7/20954 (2013.01); G02F 1/133385 (2013.01); H05K 7/20127 (2013.01)
(58) Field of Classification Search
CPC ........... H05K 7/20954; H05K 7/20972; H05K 7/20127; H05K 7/20136; H05K 7/20145;
(Continued)

(56) References Cited

U.S. PATENT DOCUMENTS

| 8,035,968 B2 | 10/2011 | Kwon et al. |
| 10,492,345 B2 | 11/2019 | Kim et al. |
(Continued)

FOREIGN PATENT DOCUMENTS

| JP | 2000156581 A | * | 6/2000 | ......... G02F 1/13452 |
| KR | 10-2007-0048294 A | | 5/2007 | |
(Continued)

OTHER PUBLICATIONS

Oonishi, Hiroyuki; "Display Apparatus"; Aug. 2, 2012; Sharp KK; Full Text (WIPO Patentscope Machine Translation via WIPO Translate of WO 2012102179) (Year: 2012).*
(Continued)

*Primary Examiner* — Jayprakash N Gandhi
(74) *Attorney, Agent, or Firm* — F. CHAU & ASSOCIATES, LLC

(57) ABSTRACT

An electronic device includes a display panel, a first circuit board electrically connected to the display panel, a second circuit board electrically connected to the display panel and spaced apart from the first circuit board in a first direction, and a housing including an internal space that accommodates the display panel, the first circuit board, and the second circuit board, the housing includes a first opening exposing the internal space and closer to the first circuit board than to the second circuit board, and a second opening exposing the internal space, spaced apart from the first opening, and disposed between the first circuit board and the second circuit board, and holes passing through the housing are included in each of the first opening and the second opening of the housing.

20 Claims, 13 Drawing Sheets
(3 of 13 Drawing Sheet(s) Filed in Color)

(58) Field of Classification Search
CPC ......... G02F 1/133385; G02F 1/133308; G02F
1/133314; G02F 2201/36; G06F 1/1601;
G06F 1/20
See application file for complete search history.

(56) References Cited

U.S. PATENT DOCUMENTS

| | | | |
|---|---|---|---|
| 2002/0179286 A1* | 12/2002 | Sterner | F28D 15/02 257/E23.099 |
| 2008/0285290 A1* | 11/2008 | Ohashi | G02B 6/0085 362/373 |
| 2009/0009047 A1* | 1/2009 | Yanagawa | H05K 7/20972 313/46 |
| 2009/0115919 A1* | 5/2009 | Tanaka | H05K 7/20972 348/836 |
| 2009/0225240 A1* | 9/2009 | Suzuki | H04N 5/64 345/87 |
| 2010/0172098 A1* | 7/2010 | Isoshima | H05K 7/20972 361/697 |
| 2012/0236499 A1* | 9/2012 | Murayama | H05K 7/20972 361/696 |
| 2014/0054025 A1* | 2/2014 | DeCarr | H05K 7/20945 236/94 |
| 2017/0094779 A1* | 3/2017 | Go | H05K 1/0201 |
| 2019/0302563 A1* | 10/2019 | Veenman | G02F 1/1533 |
| 2021/0149241 A1 | 5/2021 | Kim et al. | |

FOREIGN PATENT DOCUMENTS

| | | | | |
|---|---|---|---|---|
| KR | 10-1435801 | 8/2014 | | |
| KR | 10-2020-0079154 | 7/2020 | | |
| KR | 10-2193772 | 12/2020 | | |
| KR | 10-2021-0060708 | 5/2021 | | |
| WO | WO-2012102179 A1 * | 8/2012 | ......... | G02F 1/13452 |

OTHER PUBLICATIONS

Takahashi, Atsushi; "Radiator of Plasma Display"; Jun. 6, 2000; Fujitsu General Ltd; Description (Espacenet Machine Translation of JP 2000156581 A) (Year: 2000).*
"Body." Merriam-Webster.com Dictionary, Merriam-Webster, https://www.merriam-webster.com/dictionary/body. Accessed Jul. 12, 2025. (Year: 2025).*
Notice of Allowance dated Apr. 28, 2026 from the Korean Patent Office issued in the corresponding Korean Patent Application.

* cited by examiner

ELECTRONIC DEVICE

CROSS-REFERENCE TO RELATED APPLICATIONS

This application claims priority to and benefits of Korean Patent Application No. 10-2021-0116570 under 35 U.S.C. § 119 filed on Sep. 1, 2021, in the Korean Intellectual Property Office, the entire contents of which are incorporated herein by reference.

BACKGROUND

1. Technical Field

Embodiments described herein relate to an electronic device, and, to an electronic device having heat dissipation properties.

2. Description of the Related Art

An electronic device, which is a device driven by an electric signal, may include a display panel, a circuit board, and various electronic components. The display panel may include various display panels driven by the electric signal, and examples of the display panel may include a liquid crystal display (LCD), a plasma display panel (PDP), an electrophoretic display panel, an organic light emitting diode (OLED) panel, a quantum dot display panel, or the like.

A temperature inside of the electronic device increases due to heat generated in case that the display panel, the circuit board, or the like is driven. As the temperature inside of the electronic device increases, electronic components such as elements of the display panel or driving elements of the circuit board may be degraded. Accordingly, a lifetime of the electronic device is shortened, and display quality is degraded.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Thus, embodiments provide an electronic device having improved heat dissipation properties.

According to an embodiment, an electronic device may include a display panel; a first circuit board electrically connected to the display panel; a second circuit board electrically connected to the display panel and spaced apart from the first circuit board in a first direction; and a housing including an internal space that accommodates the display panel, the first circuit board, and the second circuit board, wherein the housing may include a first opening exposing the internal space and closer to the first circuit board than the first circuit board; and a second opening exposing the internal space, spaced apart from the first opening, and disposed between the first circuit board and the second circuit board, and holes passing through the housing are included in each of the first opening and the second opening of the housing.

A width of the first opening in a second direction intersecting the first direction may be less than or equal to a width of the second opening in the second direction.

The housing may include a rear surface covering a rear surface of the display panel; a first side surface extending in a second direction intersecting the first direction, connected to the rear surface part, and closer to the first circuit board than the second circuit board; a second side surface connected to the rear surface part, parallel to the first side surface, spaced apart from the first side surface in the first direction, and closer to the second circuit board; and a third side surface and a fourth side surface connected to the rear surface part, spaced apart from each other in the second direction intersecting the first direction and facing each other, and the second opening may be defined by the rear surface part.

The second opening may include a first part bent from the rear surface part toward the internal space; a second part bent from the rear surface part toward the internal space and parallel to the first part; and a third part connected to the first part and the second part, wherein the first part, the second part, and the third part may define a shape recessed from the rear surface part when viewed from an outside of the electronic device.

Second holes in the second opening may pass through the first part.

First holes in the first opening may pass through the first side surface, and a passing direction of each of the first holes may be identical to a passing direction of each of the second holes.

First holes in the first opening may pass through the rear surface part, and a passing direction of each of the first holes may be different from a passing direction of each of the second holes.

The second part may shield the internal space from the outside of the electronic device.

The second part may include a hole that exposes the internal space and the outside of the electronic device.

The electronic device according to an embodiment may further include a third opening spaced apart from the second opening in the first direction, the second circuit board may be disposed between the third opening and the second opening.

The third opening may be disposed in the second side surface, and the third opening may include third holes passing through the second side surface.

The third opening may be disposed in the rear surface part.

According to an embodiment, an electronic device may include a display panel; a first circuit board electrically connected to the display panel, the first circuit board having a first width in a first direction; a second circuit board electrically connected to the display panel, the second circuit board having a second width in the first direction, and spaced apart from the first circuit board in a second direction intersecting the first direction; and a housing including an internal space that accommodates the display panel, the first circuit board, and the second circuit board, wherein the housing may include a rear surface part parallel to a plane defined by the first direction and the second direction; a first side surface bent from the rear surface part in a third direction intersecting the first direction and the second direction; a second side surface bent from the rear surface part in the third direction and parallel to the first side surface; a third side surface bent from the rear surface part in the third direction and connected to the first side surface and the second side surface; a fourth side surface bent from the rear surface part in the third direction, spaced apart from the third side surface in the first direction, and parallel to the third side surface; a first opening including first holes exposing the internal space and an outside of the electronic device, and a second opening spaced apart from the first opening, disposed between the first circuit board and the second circuit board, and including second holes exposing the internal space and the outside of the electronic device, the first opening and the second opening are spaced apart from each other in the second direction, the first circuit board is disposed between the first opening and the second opening.

The second opening may be recessed toward the internal space from the rear surface part, and a passing direction of each of the second holes may be parallel to the second direction.

The first opening may be disposed in the first side surface, and a passing direction of each of the first holes may be identical to the passing direction of each of the second holes.

The first opening may be disposed in the rear surface part, and a passing direction of each of the first holes may be different from the passing direction of each of the second holes.

The electronic device according to an embodiment may further include a third opening including third holes passing through the second side surface.

The electronic device according to an embodiment may further include a third opening disposed in the rear surface part and spaced apart from the second opening in the second direction, the second circuit board may be disposed between the third opening and the second opening.

A width of the first opening in the first direction may be less than or equal to the first width of the first circuit board.

A width of the second opening in the first direction may be greater than or equal to the first width of the first circuit board.

BRIEF DESCRIPTION OF THE DRAWINGS

The above and other objects and features of the disclosure will become apparent by describing in detail embodiments thereof with reference to the accompanying drawings. The patent or application file contains at least one drawing executed in color. Copies of this patent or patent application publication with color drawings will be provided by the Office upon request and payment of the necessary fee.

DETAILED DESCRIPTION OF THE EMBODIMENTS

Figure 1:
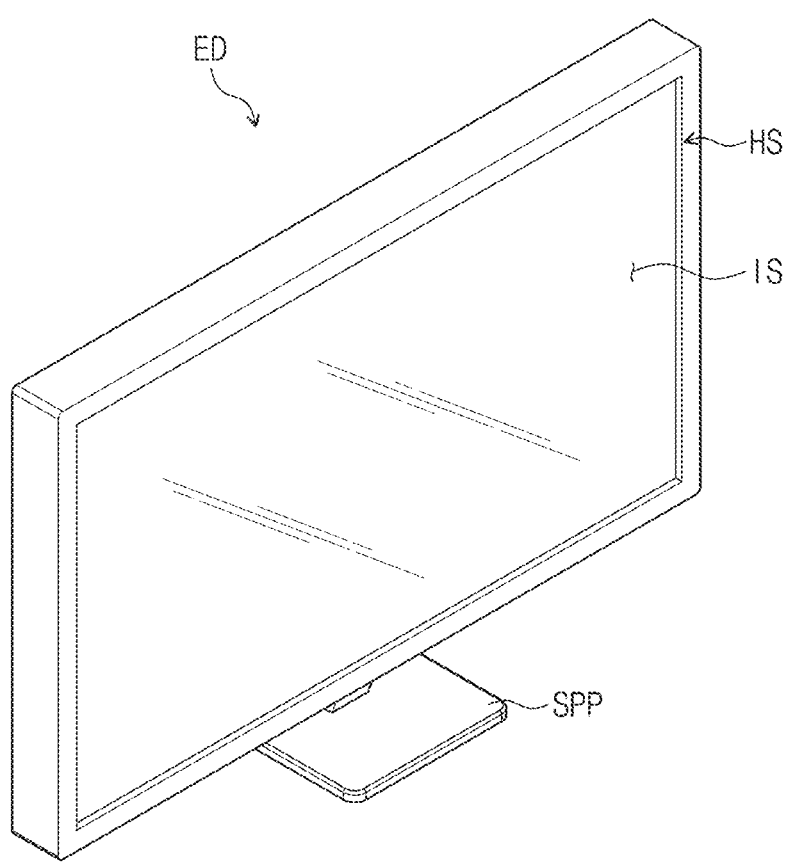
FIG. 1 is a schematic perspective view of an electronic device according to an embodiment.
Figure 1:
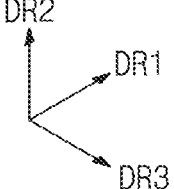

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the specification, the expression that a first component (or area, layer, part, portion, etc.) is "disposed on", "connected with" or "coupled to" a second component means that the first component is directly disposed on/connected with/coupled to the second component or means that a third component or another component is interposed therebetween.

It will be understood that the terms "connected to" or "coupled to" may include a physical or electrical connection or coupling.

The same reference numerals refer to the same components. Further, in drawings, the thickness, the ratio, and the dimension of components are exaggerated for effective description.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

The terms "first", "second", etc. are used to describe various components, but the components should not be limited by the terms. The terms are only used to distinguish one component from another component. For example, without departing from the scope and spirit of the disclosure, a first component may be referred to as a second component, and similarly, the second component may be also referred to as the first component.

Singular expressions include plural expressions unless clearly otherwise indicated in the context. For example, as used herein, the singular forms, "a," "an," and "the" are intended to include the plural forms as well, unless the context clearly indicates otherwise.

Further, the terms "under", "beneath", "on", "above", etc. are used to describe a relationship between components illustrated in the drawings. The terms have relative concepts and are described with reference to a direction indicated in the drawing but are not limited thereto.

For example, the spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

It will be understood that the terms "include", "comprise", "have", and variations thereof specify the presence of features, numbers, steps, operations, elements, or components, described in the specification, or a combination thereof, not precluding the presence or additional possibility of one or more other features, numbers, steps, operations, elements, or components or a combination thereof.

The phrase "in a plan view" means viewing the object from the top, and the phrase "in a schematic cross-sectional view" means viewing a cross-section of which the object is vertically cut from the side.

Hereinafter, an embodiment will be described with reference to accompanying drawings.

Since the disclosure is variously modified and has alternative forms, an embodiment thereof will be illustrated in the drawings and will herein be described in detail. However, it should be understood that the disclosure is not limited to a specific disclosure and includes all changes, equivalents, and substitutes included in the spirit and scope of the disclosure.

In the specification, the expression that a first component (or area, layer, part, portion, etc.) is "disposed on", "connected with" or "coupled to" a second component means that the first component is directly disposed on/connected with/coupled to the second component or means that a third component or another component is interposed therebetween.

In the application, the expression "directly arranged or disposed" may mean that a layer, a film, a region, a plate, and the like added between parts such as a layer, a film, a region, and a plate and another part are not present. For example, the expression "directly arranged or disposed" may mean that two layers or two members or more are arranged or disposed without an additional member such as an adhesive member or the like therebetween.

The same reference numerals refer to the same components. Further, in drawings, the thickness, the ratio, and the dimension of components are exaggerated for effective description of technical contents.

Further, the terms "under", "beneath", "on", "above", etc. are used to describe a relationship between components illustrated in the drawings. The terms have relative concepts and are described with reference to a direction indicated in the drawing but are not limited thereto. In the specification, the expression "arranged or disposed on" may indicate a case in which a first component is arranged or disposed not only on an upper part but also on a lower part of a second component.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Hereinafter, a light source member, a method of manufacturing the light source member, and a display device including the light source member will be described with reference to the accompanying drawings.

Figure 2:
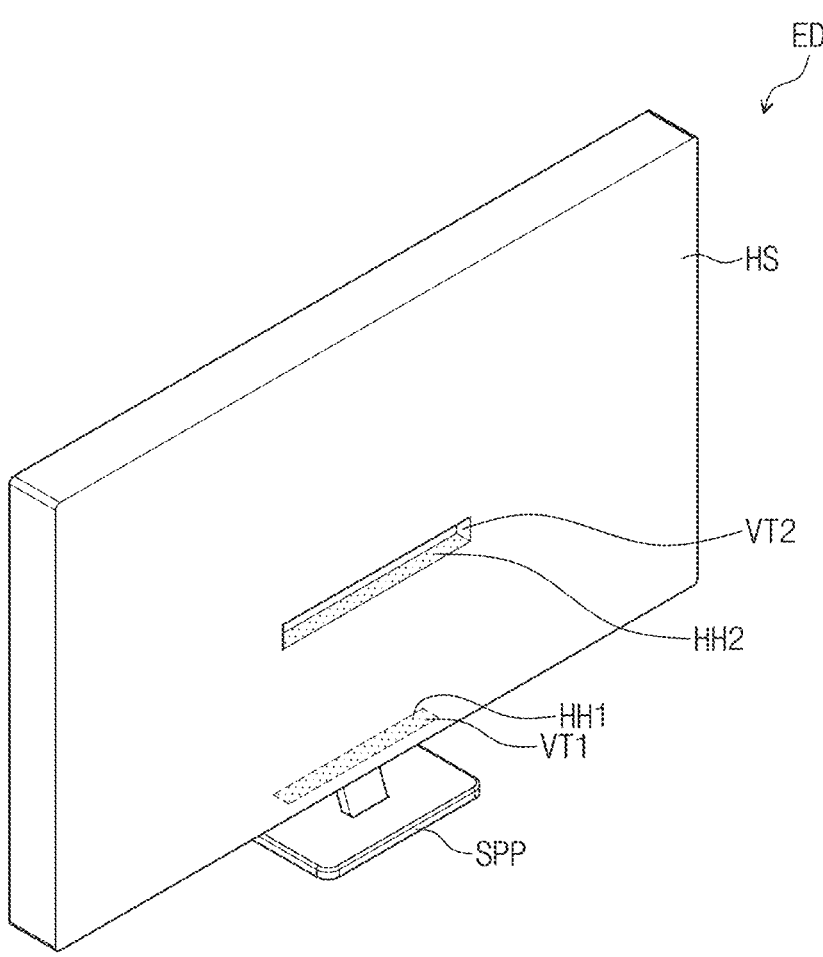
FIG. 2 is a schematic perspective view of the electronic device illustrated in FIG. 1.
Figure 2:
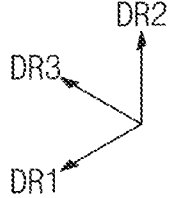

FIGS. 1 and 2 are schematic perspective views of an electronic device according to an embodiment. FIG. 1 is a schematic perspective view of the electronic device when viewed from the front surface, and FIG. 2 is a schematic perspective view of the electronic device when viewed from the rear surface. The front surface may be a surface on which a display surface IS may be located. Hereinafter, the disclosure will be described with reference to FIGS. 1 and 2.

An electronic device ED according to an embodiment may include a display device DD and a housing HS. The electronic device ED illustrated in FIG. 1 may be a large electronic device such as a television, a monitor, or an external billboard. Those listed as examples of the electronic device ED are presented as an embodiment, and may be employed as other electronic devices without departing from the spirit and scope of the disclosure. For example, the electronic device ED may be a small-sized or medium-sized electronic device such as a smart phone, a personal computer, a laptop, a personal digital terminal, a car navigation, and a game console. The electronic device ED may display an image through the display surface IS.

FIG. 1 illustrates a case in which the display surface IS provided in a surface defined by a first direction DR1 and a second direction DR2 intersecting the first direction DR1. However, an embodiment is not limited thereto, and in an embodiment, the display surface IS may be provided in a curved surface. For example, the electronic device ED may include the display panel (DP, refer to FIG. 3) having the flat display surface IS or may include a curved display device.

The electronic device ED or the display panel DP may have a three-dimensional shape having a thickness in a third direction DR3 perpendicular to a plane defined by the first direction DR1 and the second direction DR2. In the specification, an upper surface (or a front surface) and a lower surface (or a rear surface) of each component are defined on the basis of a direction in which an image is displayed on the display surface IS. The upper surface and the lower surface may be opposite to each other with respect to the third direction DR3, and a normal direction of each of the upper surface and the lower surface may be parallel to the third direction DR3. Directions indicated by the first to third directions DR1, DR2, and DR3 are relative concepts and may be changed to other directions. Hereinafter, first to third directions refer to the same reference numerals as the directions are indicated by the first to third directions DR1, DR2, and DR3, respectively.

The housing HS may include a material having a relatively high rigidity. For example, the housing HS may include frames and/or plates made of glass, plastic, or metal. The housing HS provides an accommodation space. The display panel DP may be accommodated in the accommodation space to be protected from an external impact. Further, unlike that illustrated in FIG. 1, in the case of the electronic device ED including a curved display surface IS, the housing HS may have a curved shape, and the display panel DP may be fixed in a curved form according to the shape of the housing HS having a curved shape. It is to be understood that the shapes disclosed herein may be shapes substantial to the shapes disclosed herein.

Referring to FIG. 2, the housing HS may include a first opening VT1 and a second opening VT2. The respective first and second openings VT1 and VT2 may be air vents through which air is discharged or introduced.

The first opening VT1 may include first holes HH1, and the second opening VT2 may include second holes HH2. The electronic device ED may have an improved heat dissipation property through the housing HS including the first and second openings VT1 and VT2. A detailed description thereof will be described below.

The electronic device ED may further include a support SPP. The support SPP supports the housing HS so that the electronic device ED is stably held. This is illustrated as an example, and in the electronic device ED, the support SPP may be omitted. According to the shape of the housing HS, the housing HS may serve as a stable holder for the electronic device ED.

Figure 3:
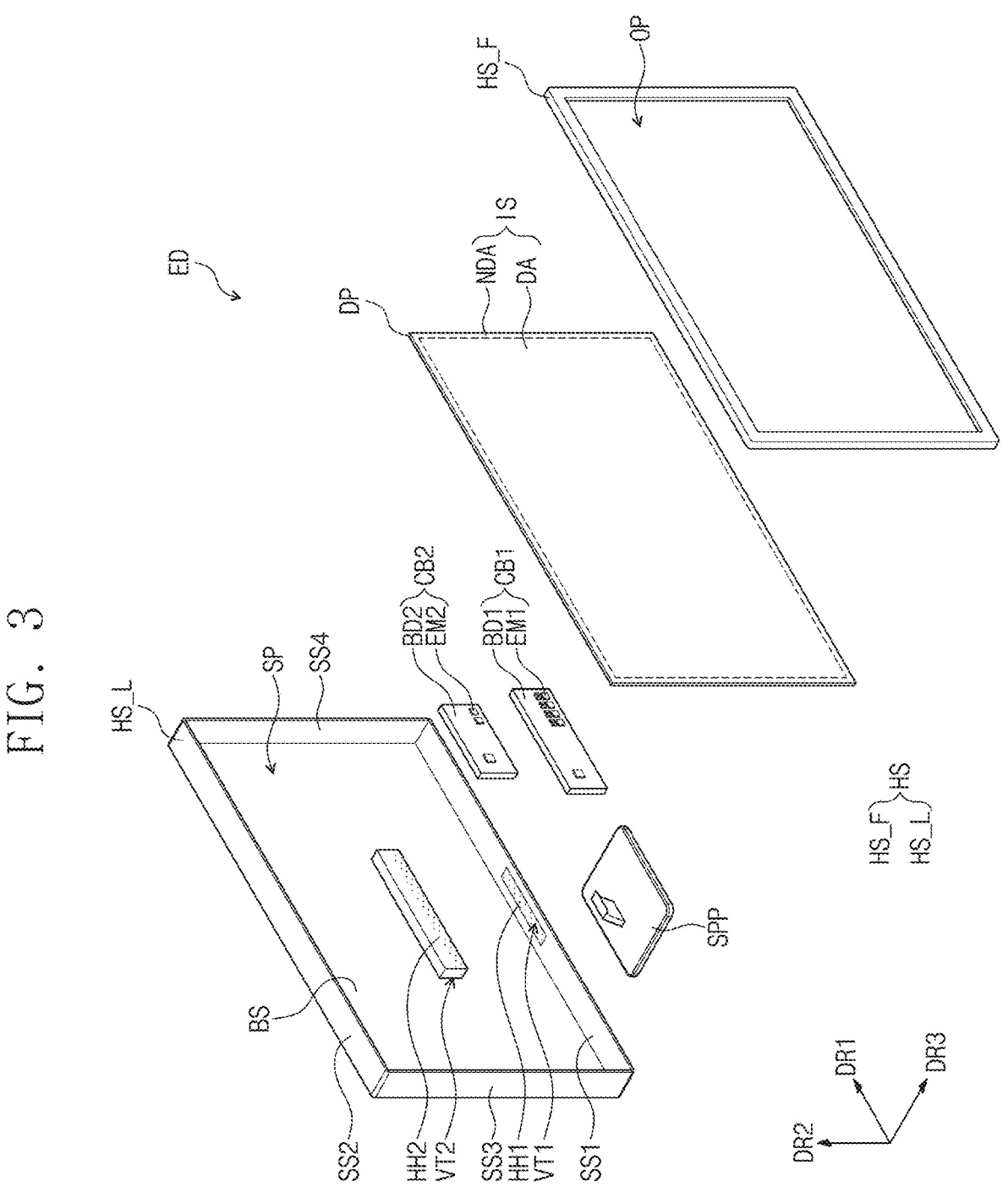
FIG. 3 is an exploded perspective view of the electronic device according to an embodiment.

FIG. 3 is an exploded perspective view of the electronic device according to an embodiment. The disclosure will be described with reference to FIG. 3.

As illustrated in FIG. 3, the electronic device ED may include a front frame HS_F, a rear frame HS_L, the display panel DP, circuit boards CB1 and CB2, and the support SPP. The front frame HS_F and the rear frame HS_L are coupled or connected to each other to form the housing HS.

The front frame HS_F covers or overlaps the display surface IS of the display panel DP. The front frame HS_F may include an open opening OP. The front frame HS_F may expose the display panel DP through the opening OP. A user may visually recognize, through the opening OP, an image displayed on the display panel DP.

The display panel DP displays the image according to an electric signal. The display surface IS of the display panel DP may include a display area DA on which the image is displayed and a surrounding area NDA adjacent thereto. The display area DA is an area on which the image is displayed and may correspond to an area in which light emitting regions are arranged or disposed. The surrounding area NDA is an area in which no light emitting element is disposed and corresponds to an area in which light is not emitted. The front frame HS_F may cover or overlap the surrounding area NDA and may be provided to have a shape corresponding to the surrounding area NDA. In an embodiment, the surrounding area NDA is illustrated in a frame shape surrounding the display area DA, but the disclosure is not limited thereto, and the surrounding area NDA may be adjacent to at least one side or a side of the display area DA or may be omitted and is not limited to an embodiment.

The circuit boards CB1 and CB2 may include the first circuit board CB1 and the second circuit board CB2. The first circuit board CB1 and the second circuit board CB2 are spaced apart from each other in the second direction DR2. The first circuit board CB1 and the second circuit board CB2 may be electrically connected to the display panel DP. The first circuit board CB1 and the second circuit board CB2 may include substrates BD1 and BD2 and electronic elements EM1 and EM2.

The first circuit board CB1 may include the first substrate BD1 and the first electronic elements EM1. The first substrate BD1 may be a printed circuit board including at least one conductive layer and at least one insulation layer. The first electronic elements EM1 may be mounted on the first substrate BD1 and connected to the conductive layer. Although not illustrated, the first circuit board CB1 may be electrically connected to the display panel DP through a flexible circuit board such as a tape carrier package (TCP).

The second circuit board CB2 may include the second substrate BD2 and the second electronic elements EM2. The second substrate BD2 may be a printed circuit board including at least one conductive layer and at least one insulation layer. The second electronic elements EM2 may be mounted on the second substrate BD2 and connected to the conductive layer. Although not illustrated, the second circuit board CB2 may be electrically connected to the display panel DP or the first circuit board CB1 through a flexible circuit board.

The first circuit board CB1 and the second circuit board CB2 are electrically connected to the display panel DP to transmit and/or receive an electrical signal for driving the display panel DP. For example, the first circuit board CB1 may be a main circuit board. The first circuit board CB1 may adjust a power supply signal or image data for driving the display panel DP. The second circuit board CB2 may process the image data and provide the processed signal to the first circuit board CB1. However, this is described as an example, the first circuit board CB1 and the second circuit board CB2 may be provided in various shapes as long as the first circuit board CB1 and the second circuit board CB2 are electrically connected to the display panel DP, and are not limited to an embodiment.

The rear frame HS_L is disposed on the rear surface of the display panel DP with the display panel DP and the circuit boards CB1 and CB2 interposed therebetween and is coupled or connected to the front frame HS_F. The rear frame HS_L and the front frame HS_F are coupled or connected to each other to define an internal space SP, and the display panel DP and the circuit boards CB1 and CB2 are accommodated in the internal space SP.

The rear frame HS_L may include a rear surface part BS and side surfaces SS1, SS2, SS3, and SS4. The rear surface part BS may be parallel to the display panel DP. In an embodiment, the rear surface part BS may have a quadrangular shape defined by the first direction DR1 and the second direction DR2. However, this is illustrated as an example, but the rear surface part BS may have various shapes as long as the rear surface part BS provides the internal space SP for accommodating the display panel DP and the circuit boards CB1 and CB2 and is not limited to an embodiment.

The side surfaces SS1, SS2, SS3, and SS4 are bent from fourth sides of the rear surface part BS, respectively. The side surfaces SS1, SS2, SS3, and SS4 may define the depth of the internal space SP in the third direction DR3. The side surfaces SS1, SS2, SS3, and SS4 may include first to fourth side surfaces SS1, SS2, SS3, and SS4.

The first side surface SS1 is connected to one side or a side of the rear surface part BS extending in the first direction DR1 and extends in the first direction DR1. The first side surface SS1 may define a lower end of the housing HS.

The second side surface SS2 is connected to the other side or another side of the rear surface part BS extending in the first direction DR1 and extends in the first direction DR1. The second side surface SS2 may be spaced apart from the first side surface SS1 in the second direction DR2 and may be parallel to the first side surface SS1. The second side surface SS2 may define an upper end of the housing HS.

The third side surface SS3 is connected to one side or a side of the rear surface part BS extending in the second direction DR2 and extends in the second direction DR2. The fourth side surface SS4 is connected to the other side or another side of the rear surface part BS extending in the second direction DR2 and extends in the second direction DR2. The third side surface SS3 and the fourth side surface SS4 may be spaced apart from each other in the first direction DR1 and may be parallel to each other. The third side surface SS3 and the fourth side surface SS4 may be connected to the first side surface SS1 and the second side surface SS2.

The first opening VT1 and the second opening VT2 may be arranged or disposed in the rear frame HS_L. The first opening VT1 and the second opening VT2 are spaced apart from each other in the second direction DR2. The first opening VT1 and the second opening VT2 may be spaced apart from each other with the first circuit board CB1 interposed therebetween.

The first opening VT1 may be disposed in the first side surface SS1. The first opening VT1 may include the first holes HH1. The first holes HH1 pass through the first side surface SS1. A passing direction (an extension direction) of each of the first holes HH1 may be parallel to the second direction DR2.

The second opening VT2 may be disposed in the rear surface part BS. The second opening VT2 protrudes from the rear surface part BS to the internal space SP. The second opening VT2 may be recessed from the rear surface part BS when viewed from the outside. A detailed description thereof will be described below. The second opening VT2 may include the second holes HH2. A passing direction (an extension direction) of each of the second holes HH2 may be parallel to the second direction DR2. In an embodiment, the first holes HH1 and the second holes HH2 may pass in a same direction. However, this is illustrated as an example, but the first holes HH1 and the second holes HH2 may pass in different directions as long as the first holes HH1 and the second holes HH2 pass to allow the internal space SP and the outside of the electronic device ED to communicate with each other, and are not limited to an embodiment.

The support SPP may be separated from the housing HS. The support SPP may be coupled or connected to the rear frame HS_L among the housing HS. The coupling or connection between the support SPP and the rear frame HS_L may be made at a location that does not overlap the first opening VT1. Accordingly, the influence of the movement of the air at the first opening VT1 may be minimized due to the coupling or connection of the support SPP. The support SPP may be integral with the housing HS or omitted and is not limited to an embodiment.

Figure 4A:
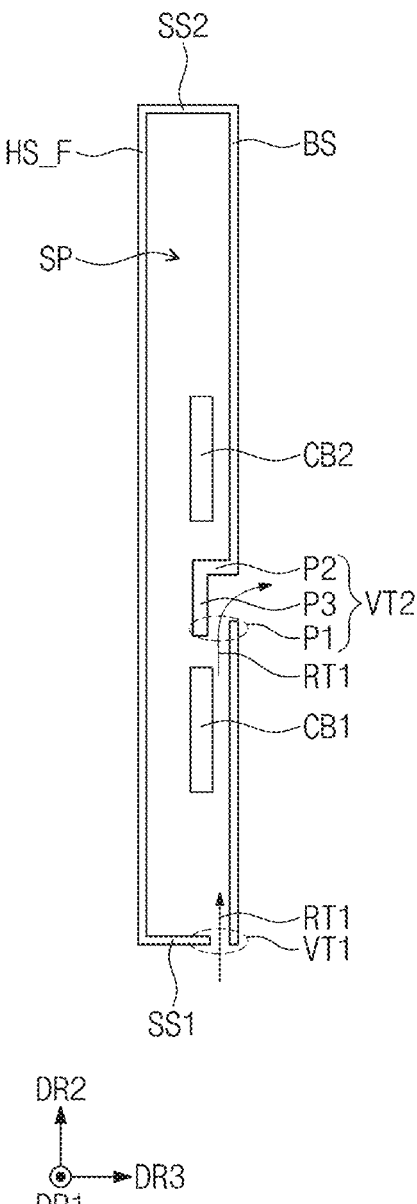
FIG. 4A is a schematic side view of a housing according to an embodiment.
Figure 4B:
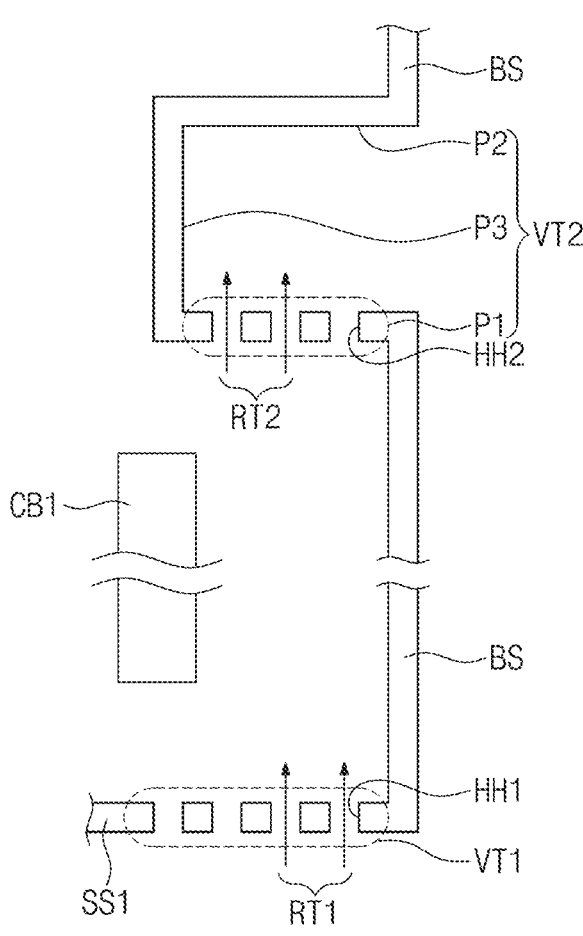
FIG. 4B is an enlarged schematic side view illustrating a part of the housing.

FIG. 4A is a side view of a housing according to an embodiment. FIG. 4B is an enlarged side view illustrating a part of the housing. In FIG. 4A, for convenience of description, the internal space of the housing HS is simplified and illustrated, and the display panel DP is omitted. Arrows RT1 and RT2 schematically illustrate the air flow. FIG. 4B is an enlarged view illustrating an area in which the first opening VT1 and the second opening VT2 are arranged or disposed in FIG. 4A. Hereinafter, the disclosure will be described with reference to FIGS. 4A and 4B. The same reference numerals are assigned to the same components as those described with reference to FIGS. 1 to 3, and a duplicated description thereof will be omitted.

As illustrated in FIGS. 4A and 4B, the first opening VT1 may be an inlet through which external air is introduced. The first holes HH1 are defined in the first opening VT1, and the air is introduced through the holes HH1. However, in an embodiment, for convenience of description, flows of the air introduced into the holes HH1 are illustrated as one flow RT1 (hereinafter, referred to as a first flow) introduced through the first opening VT1.

The first flow RT1 is an air flow introduced from the outside through the first opening VT1, and since a passing direction of each of the first holes HH1 is parallel to the second direction DR2, the first flow RT1 may have a direction parallel to the second direction DR2.

The air having the first flow RT1 may be relatively cold air as compared to an average temperature of the internal space SP. Thus, before the electronic device ED is driven, the first flow RT1 is not generated because there is no difference between the temperature of the internal space SP and the external temperature. In case that the temperature of the internal space SP increases as the electronic device ED is driven, the external air having a relatively low temperature is introduced into the internal space SP through the first opening VT1, and thus the first flow RT1 is generated.

The first flow RT1 may pass through the first circuit board CB1 to dissipate heat from the first circuit board CB1. The cold air having the first flow RT1 passes through the first circuit board CB1 and absorbs the heat generated from the first circuit board CB1 so as to prevent an increase in the temperature of the first circuit board CB1.

The air heated by the first circuit board CB1 is discharged to the outside through the second opening VT2. The second opening VT2 may be an outlet through which internal air is discharged. The second holes HH2 are defined in the second opening VT2, and the air is discharged through the holes HH2. Likewise, in an embodiment, for convenience of description, flows of the air discharged through the holes HH2 are illustrated as one flow RT2 (hereinafter, referred to as a second flow) discharged through the second opening VT2.

The second flow RT2 is an air flow discharged to the outside through the second opening VT2, and since a passing direction of each of the second holes HH2 is parallel to the second direction DR2, the second flow RT2 may include a direction parallel to the second direction DR2.

The air having the second flow RT2 may be relatively hot air as compared to the average temperature of the internal space SP. Thus, before the electronic device ED is driven, the second flow RT2 is not generated because there is no difference between the temperature of the internal space SP and the external temperature. In case that the temperature of the internal space SP increases as the electronic device ED is driven, the internal air having a relatively high temperature is discharged to the outside through the second opening VT2, and thus the second flow RT2 is generated.

The air having the second flow RT2 may be at least a portion of the air heated by the first circuit board CB1. The second flow RT2 and the first flow RT1 are generated while influencing each other. The first flow RT1 and the second flow RT2 mutually accelerate generations thereof, and thus a natural convection, for example, the air flow, from the first opening VT1 to the second opening VT2 may be naturally generated.

The second flow RT2 may have a flow bent at least once. This may be a change of a path due to the shape of the second opening VT2 recessed into the internal space when viewed from the outside. In an embodiment, the second opening VT2 may include a first part P1, a second part P2, and a third part P3. The first part P1, the second part P2, and the third part P3 are connected to each other so that the second opening VT2 having a shape recessed toward the internal space SP is formed in the rear surface part BS.

In detail, referring to FIG. 4B, the first part P1 may be a surface parallel to the first side surface SS1. The first part P1 is connected to the rear surface part BS and is bent from the rear surface part BS. The second holes HH2 may be defined to pass through the first part P1. The passing direction of each of the second holes HH2 may be parallel to the second direction DR2. The passing direction of each of the second holes HH2 may be the same as the passing direction of each of the first holes HH1. Accordingly, the air having the first flow RT1 may be readily discharged to the outside through the second holes HH2.

The second part P2 is connected to the rear surface part BS and is bent from the rear surface part BS. The second part P2 may be spaced apart from the first part P1 in the second direction DR2 and may be parallel to the first part P1. The third part P3 connects the first part P1 and the second part P2. The third part P3 may be parallel to the rear surface part BS.

The air discharged through the second holes HH2 may have a path that is changed by the second part P2 and the third part P3, and thus may have the second flow RT2 in which the air is discharged in a direction parallel to the third direction DR3. According to the disclosure, the second opening VT2 may include the second part P2 and the third part P3, thereby preventing the air heated by the first circuit board CB1 from being introduced into the second circuit board CB2. Accordingly, the second circuit board CB2 may be prevented from being rather overheated by the air having the second flow RT2.

For example, the second opening VT2 has a shape that is recessed toward the internal space SP when viewed from the outside and protrudes toward the internal space SP when viewed from the inside, and thus the air heated by the first circuit board CB1 may be prevented from being moved into the second circuit board CB2. Thus, since independent heat dissipation of the first circuit board CB1 and the second circuit board CB2 may be achieved, problems may be prevented that heat dissipation properties of the second circuit board CB2 relatively far from the first opening VT1 are relatively degraded or the second circuit board CB2 is overheated by the first circuit board CB1.

Further, according to the disclosure, the second opening VT2 may include the second part P2 and the third part P3 so that the second flow RT2 is bent and thus the heated air may be immediately separated from the housing HS. Accordingly, the electronic device ED may have an improved heat dissipation effect. Accordingly, the lifetime and the reliability of the electronic device ED may be improved.

In an embodiment, the circuit boards CB1 and CB2 having relatively high heat generation properties have been described. However, it is obvious that the heat may be generated even in the display panel DP, and the first and second openings VT1 and VT2 may also affect heat dissipation of the display panel DP or other electronic elements that are not illustrated and accommodated in the internal space SP.

Figure 5:
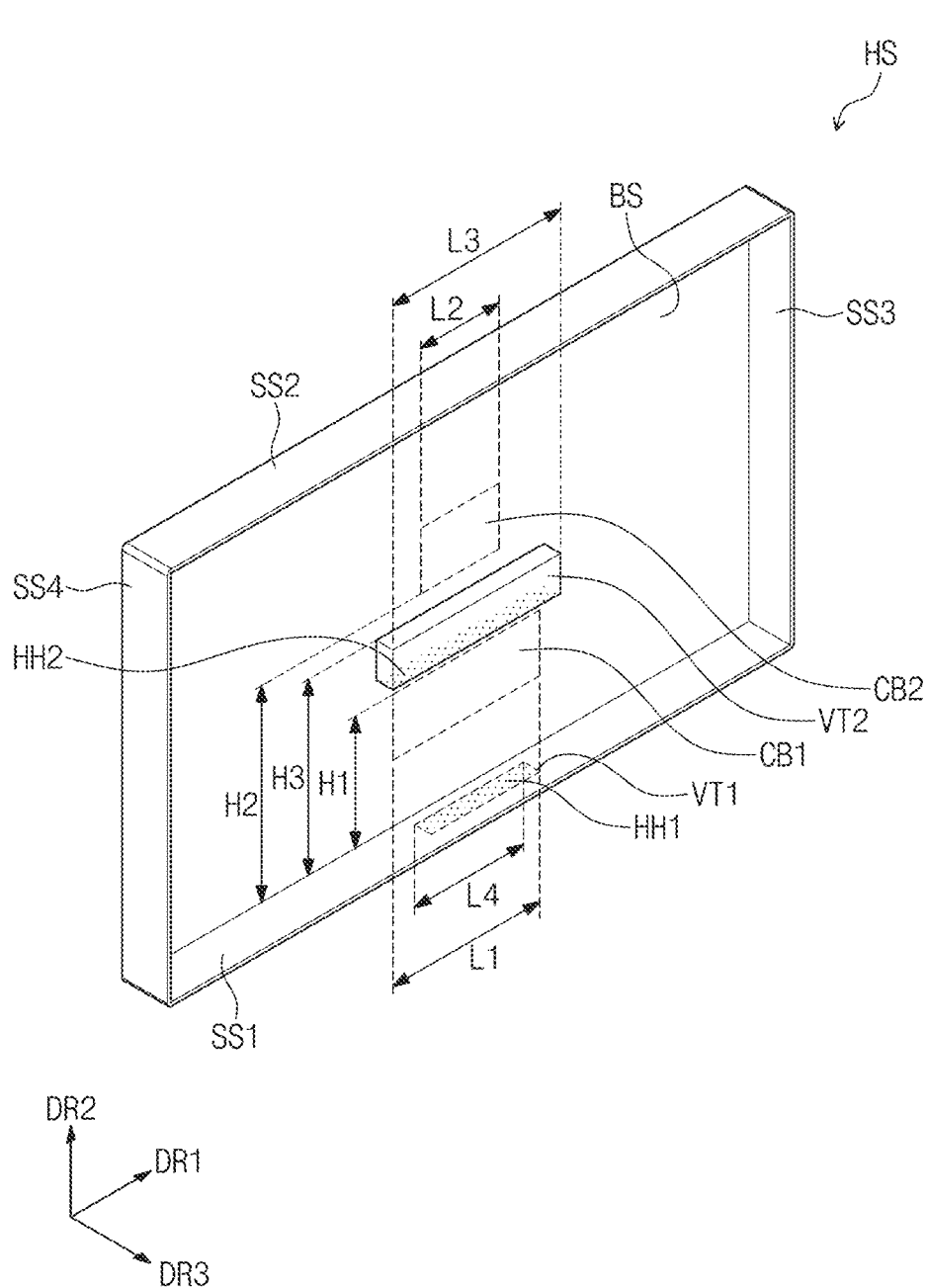
FIG. 5 is a schematic perspective view of the housing according to an embodiment.
Figure 6A:
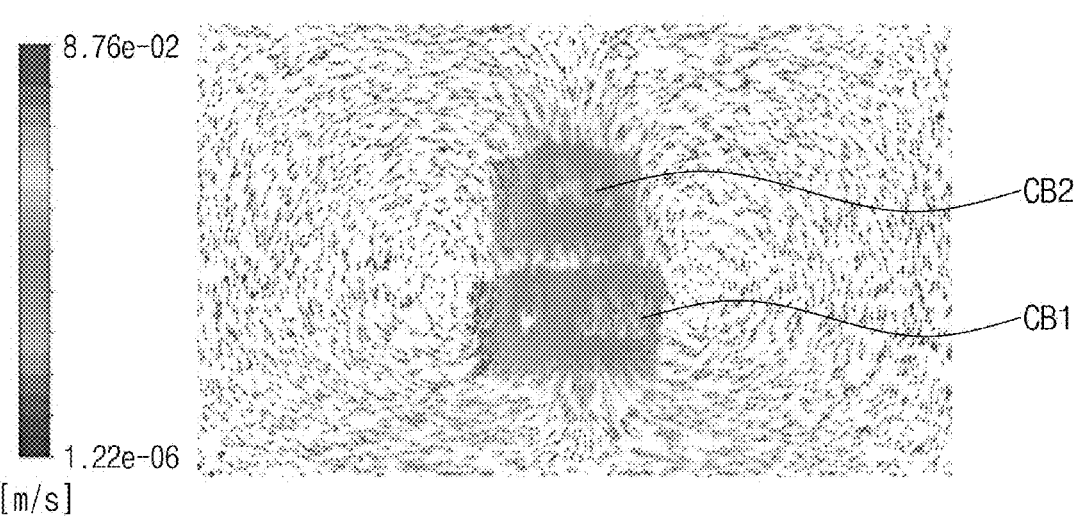
FIGS. 6A to 6C are experimental data obtained by evaluating heat dissipation properties of the electronic devices according to an embodiment and a comparative example.
Figure 6A:
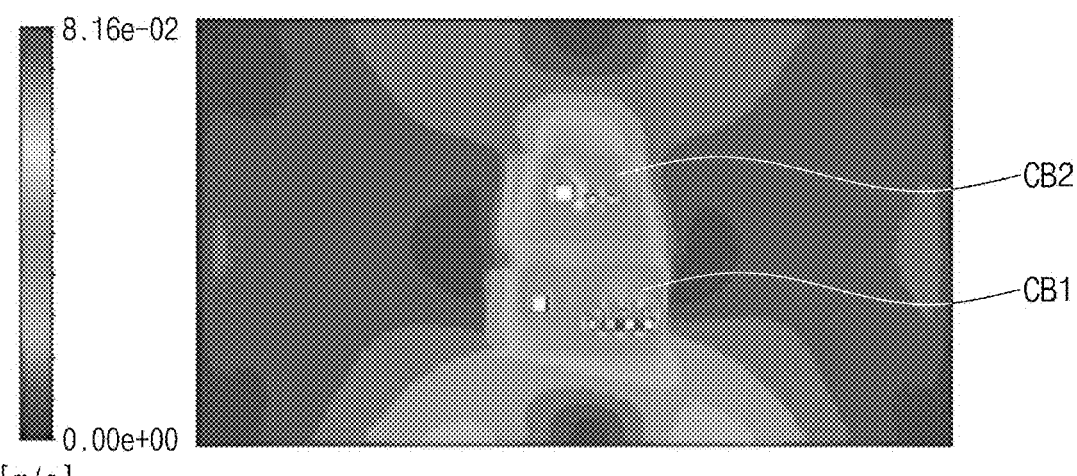
Figure 6B:
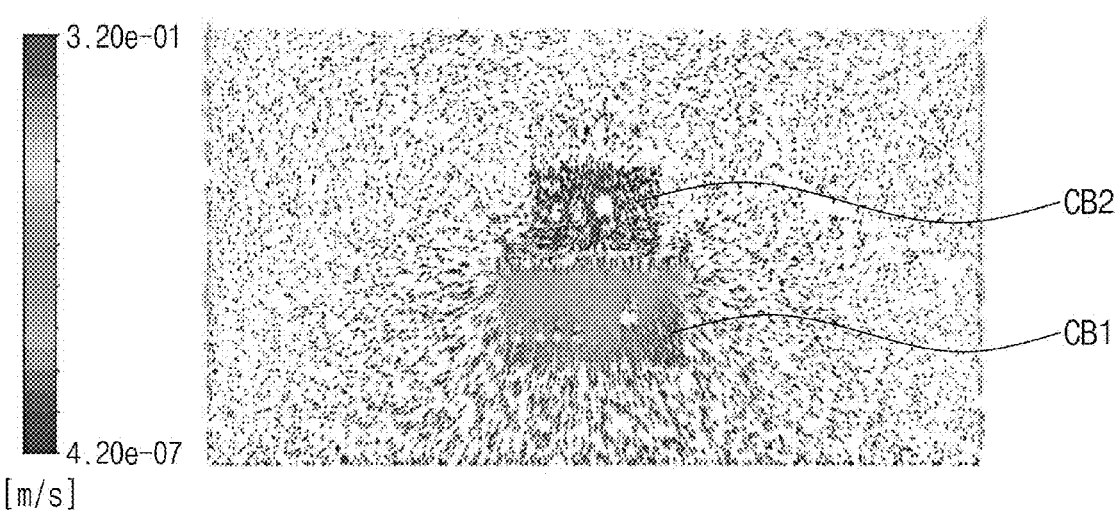
Figure 6B:
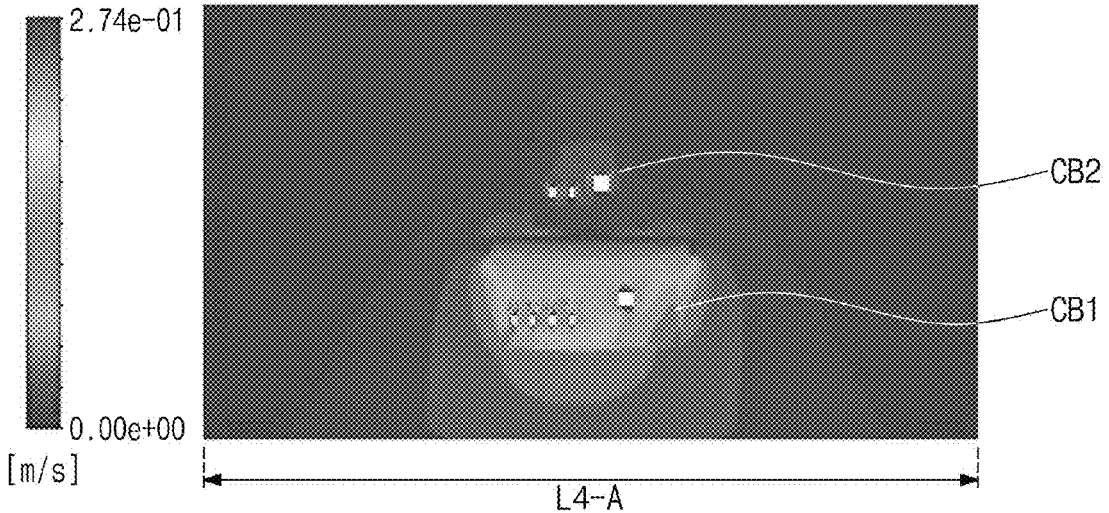
Figure 6C:
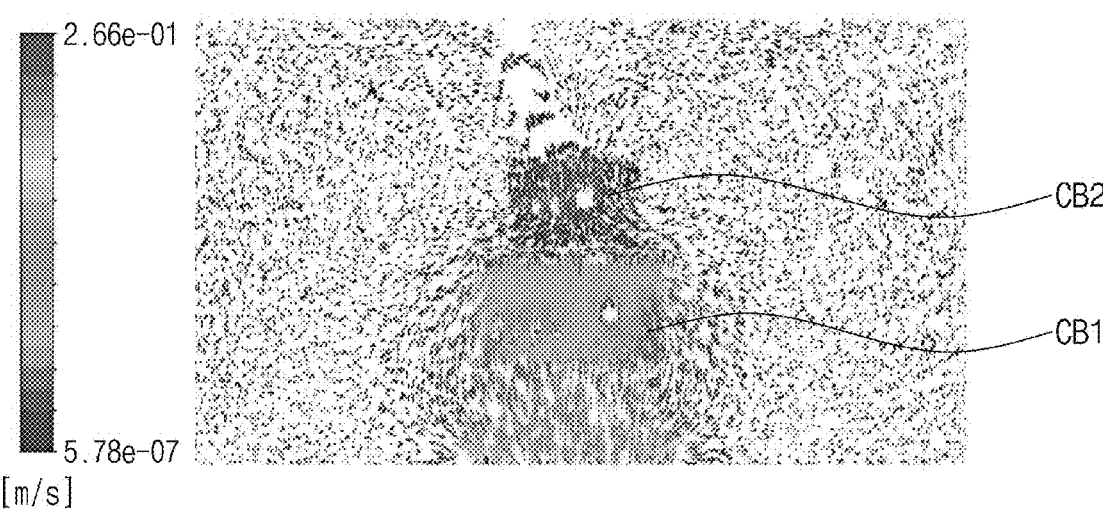
Figure 6C:
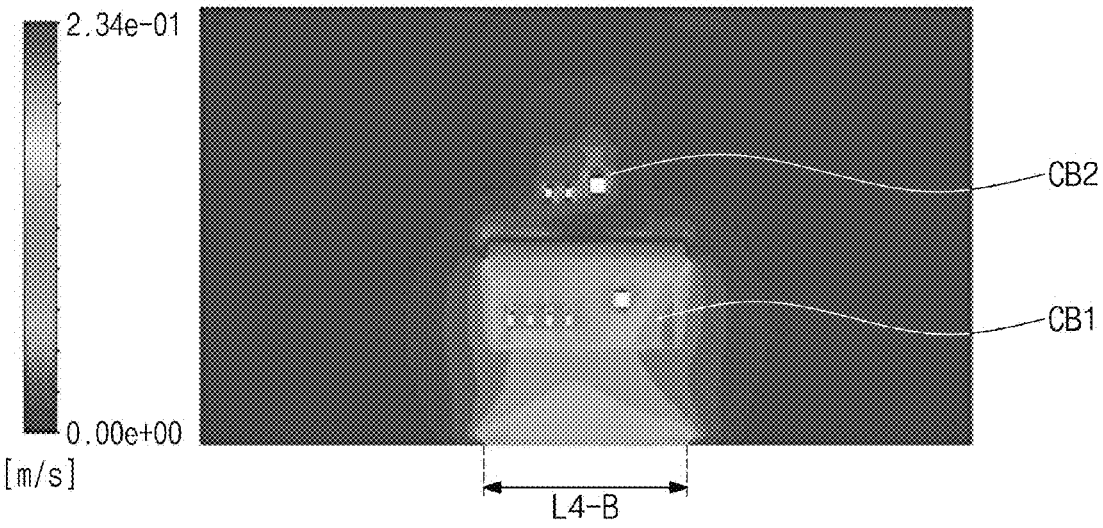

FIG. 5 is a schematic perspective view of the housing according to an embodiment. FIGS. 6A to 6C are experimental data obtained by evaluating heat dissipation properties of the electronic devices according to an embodiment and a comparative example. In FIG. 5, for convenience of description, the rear surface part BS is illustrated, and the circuit boards CB1 and CB2 are illustrated by dotted line. Hereinafter, the same reference numerals are assigned to the same components as those described with reference to FIGS. 1 to 4B, and a duplicated description thereof will be omitted.

The first opening VT1 and the second opening VT2 are spaced apart from each other in the second direction DR2. The first circuit board CB1 and the second circuit board CB2 may be spaced apart from each other in the second direction DR2. The first opening VT1 may be disposed below the first circuit board CB1, and the second opening VT2 may be disposed between the first circuit board CB1 and the second circuit board CB2. Thus, the first opening VT1, the first circuit board CB1, the second opening VT2, and the second circuit board CB2 may be sequentially arranged or disposed in the second direction DR2.

In case that the longest distance between the first opening VT1 and the first circuit board CB1 is defined as a first distance H1, and the shortest distance between the first opening VT1 and the second circuit board CB2 is defined as a second distance H2, a longest distance H3 between the first opening VT1 and the second opening VT2 may be greater than the first distance H1 and smaller (or less) than the second distance H2. The longest distance may be defined as a distance from the first opening VT1 to an upper end of each component, and the shortest distance may be defined as a distance from the first opening VT1 to a lower end of each component.

Further, in case that a width of the first circuit board CB1 in the first direction DR1 is defined as a first width L1, and a width of the second circuit board CB2 in the first direction DR1 is defined as a second width L2, a width L3 of the second opening VT2 in the first direction DR1 may be greater than the first width L1 or the second width L2. The width L3 of the second opening VT2 in the first direction DR1 may correspond to a length of an area, in which the second holes HH2 (see FIG. 2) are substantially defined, in the first direction DR1. For example, as the width L3 of the second opening VT2 in the first direction DR1 becomes larger, the number of second holes HH2 may increase, and a larger amount of the air may be discharged. Accordingly, the second flow RT2 (see FIG. 4B) of the air heated by the circuit boards CB1 and CB2 in the internal space SP (see FIG. 4B) may be stably performed through the second opening VT2. Thus, since the amount of air discharged through the second opening VT2 increases, the heat dissipation of the circuit boards CB1 and CB2 may be readily performed.

According to the disclosure, since the second opening VT2 is disposed between the circuit boards CB1 and CB2, a heat dissipation effect of the first circuit board CB1 may increase, and the air heated by the first circuit board CB1 may be prevented from being moved into the second circuit board CB2. Thus, since independent heat dissipation of the first circuit board CB1 and the second circuit board CB2 may be achieved, problems may be prevented that the heat dissipation properties of the second circuit board CB2 relatively far from the first opening VT1 are relatively degraded or the second circuit board CB2 is overheated by the first circuit board CB1.

Further, a width L4 of the first opening VT1 in the first direction DR1 may be smaller (or less) than the first width L1 or at least equal to the first width L1. For example, as the width L4 of the first opening VT1 is provided to be smaller (or less) than the first width L1, the size of an area in which the first holes HH1 are defined may be set to be smaller (or less) than or equal to the size of the first circuit board CB1. In an embodiment, the width L4 of the first opening VT1 is smaller (or less) than the width L3 of the second opening VT2 as well as the first width L1 of the first circuit board CB1. Accordingly, the first flow RT1 (see FIG. 4A) of the cold air introduced through the first opening VT1 may have a relatively higher velocity than that of the second flow RT2 (see FIG. 4B). Since the cold air introduced from the outside is introduced at a high velocity even though the cold air is introduced in a narrow width, the cold air may be readily and quickly diffused in the internal space SP. For example, by increasing the flow velocity of the cold air, the cold air may be uniformly spread to the area of the internal space SP.

FIGS. 6A to 6C illustrate simulation data. In FIGS. 6A to 6C, data arranged on the upper sides illustrates a vector of the flow velocity of the air, and data arranged on the lower sides illustrates a scalar of the flow velocity of the air. With respect to a left bar graph, a lower blue region indicates a lower flow velocity (the velocity of the air), and an upper red region indicates a higher flow velocity. The disclosure will be described in more detail with reference to FIGS. 6A to 6C.

A first comparative example illustrated in FIG. 6A corresponds to an embodiment in which the first opening VT1 is omitted. A second comparative example illustrated in FIG. 6B corresponds to an embodiment in which a width L4-A of the first opening VT1 is greater than the width of the first circuit board CB1. In an embodiment, the width L4-A of the first opening VT1 according to the second comparative example is designed to have a length corresponding to the length of the second side surface SS2. FIG. 6C is an embodiment, and corresponds to an embodiment in which a width L4-B of the first opening VT1 is the same as the width of the first circuit board CB1.

In Table 1, simulation values of temperature changes according to locations of the internal space are written. The temperatures of the locations of FIGS. 6A to 6C and temperature changes between the second comparative example and the first example based on the first comparative example are illustrated as below. The temperature change means a difference from the temperature of the first comparative example.

narrow distribution and a high temperature as compared to the first embodiment illustrated in FIG. 6C.

Unlike this, in the embodiment illustrated in FIG. 6C, since the relatively cold air is introduced over a wide range, it may be seen that the air having a low temperature is uniformly introduced over the entire width of the first circuit board CB1. Referring to the upper data of FIGS. 6A to 6C, the air flow in the internal space SP may be seen. In detail, FIG. 6A illustrates the air flow in the form of circular convection in a left-right direction with respect to the circuit boards because there is no air flow from a lower end. In FIG. 6B, the introduction of air from the lower end is illustrated, but the velocity of air particles below the first circuit board CB1 is illustrated in a blue region. Unlike this, in FIG. 6C, the air particles introduced from the lower end are illustrated in a green region and illustrate a faster flow velocity having higher density. For example, in FIG. 6C, it may be seen that the relatively cold air is introduced at a higher velocity and provided to the first circuit board CB1.

Referring to the lower data of FIGS. 6A to 6C, the temperature distribution in the internal space SP may be seen. It may be seen that higher heat dissipation properties are achieved in FIG. 6C because the color of a space adjacent to the first circuit board CB1 is blue in FIG. 6B but is green in FIG. 6C. For example, it may be seen that the decreases in the temperatures of the first circuit board CB1, the second circuit board CB2, and the display panel DP are largest in FIG. 6C in which the width L4 of the first opening VT1 is set to be narrower than the first width L1.

According to the disclosure, the width L4 of the first opening VT1 is provided to be smaller (or less) than or at least equal to the first width L1, and the width L3 of the second opening VT2 is provided to be greater than the width L4 of the first opening VT1, the first width L1, and the second width L2. Thus, an inflow velocity of the cold air may increase, and outflow of hot air may be facilitated. As the inflow velocity of the cold air increases, a velocity at which the cold air reaches a heat emitting element increases as well as the straightness of the cold air to the heat emitting element is improved, which may be effective in increasing the heat dissipation effect. Accordingly, the natural convection may be made more smoothly, and thus the heat dissipation effect may be improved.

TABLE 1

| Location | First Comparative Example | Second Comparative Example | Temperature change | First Embodiment | Temperature change |
|---|---|---|---|---|---|
| Maximum temperature of display panel (° C.) | 55.73 | 55.45 | −0.29 | 55.09 | −0.64 |
| Average temperature of display panel (° C.) | 48.81 | 47.78 | −1.03 | 47.64 | −1.17 |
| Temperature of first circuit board (° C.) | 68.61 | 68.70 | +0.09 | 68.49 | −0.11 |
| Temperature of second circuit board (° C.) | 70.61 | 70.75 | +0.14 | 70.57 | −0.04 |

Referring to Table 1, in the first comparative example in which the first opening VT1 is omitted, it may be seen that the temperatures of the circuit boards CB1 and CB2 are higher than those in an embodiment. Further, it may be seen that in case that the width L4-A of the first opening VT1 is greater than the width of the first circuit board CB1, a heat dissipation effect is exhibited compared to the first comparative example, but the introduced cold air has relatively In case that the width L4 of the first opening VT1 is too small, the natural convection may be difficult to occur as in the first comparative example illustrated in FIG. 6A. Thus, the width L4 of the first opening VT1 is large enough to enable the formation of the first flow RT1 for dissipating heat of the first circuit board CB1, and may be smaller (or less) than or at least equal to the width L1 of the first circuit board CB1.

Further, according to the disclosure, the natural convection is used, and thus artificial heat dissipation equipment such as a heat dissipation fan may be omitted. Accordingly, the cost may be reduced, the user may be free from noise problems, and thus the user's convenience may be improved.

In an embodiment, the first circuit board CB1 having the relatively large width L1 is disposed to be closer to the first opening VT1, and thus the heat dissipation properties of the first circuit board CB1 that is a relatively large heat emitting element may increase. However, the disclosure is not limited thereto, and the second circuit board CB2 having the smaller width L2 may be disposed to be closer to the first opening VT1, and is not limited to an embodiment.

FIGS. 7A to 7D are schematic side views of the housing according to an embodiment. FIGS. 7A to 7D illustrate regions corresponding to FIG. 4. Hereinafter, the disclosure will be described with reference to FIGS. 7A to 7D. The same reference numerals are assigned to the same components as those described with reference to FIGS. 1 to 6C, and a duplicated description thereof will be omitted.

Figure 7A:
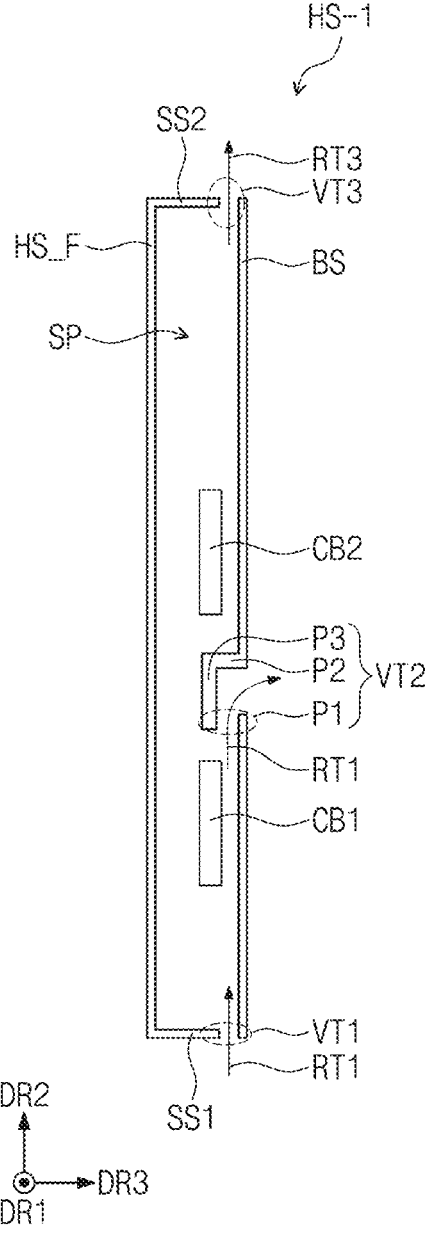
FIGS. 7A to 7D are schematic side views of the housing according to an embodiment.

As illustrated in FIG. 7A, a housing HS-1 may further include a third opening VT3. The third opening VT3 may be provided in the second side surface SS2. The third opening VT3 may be an outlet through which the air in the internal space SP is discharged to the outside. Although not illustrated, holes (not illustrated) are defined in the third opening VT3, and thus the air is discharged through the holes. In an embodiment, for convenience of description, air flows discharged through the holes are indicated as one arrow introduced through the third opening VT3.

Accordingly, a third flow RT3 (RT3-1 of FIG. 7D) that is a flow of the hot air discharged through the third opening VT3 in addition to the first flow RT1 that is the flow of the cold air introduced through the first opening VT1 and the second flow RT2 that is a flow of the hot air discharged through the second opening VT2 may be generated in the housing HS-1. The third flow RT3 may be an air flow passing through the first circuit board CB1 and the second circuit board CB2 and may be an air flow heated by heat generated from the first circuit board CB1 and the second circuit board CB2. Accordingly, the air having the third flow RT3 may have a temperature that is higher than that of the air having the first flow RT1 or have a temperature that is equal to or higher than that of the air having the second flow RT2. According to the disclosure, as the third opening VT3 is further included, the hot air in the internal space SP may be readily discharged to the outside, and the natural convection may be effectively achieved.

Figure 7B:
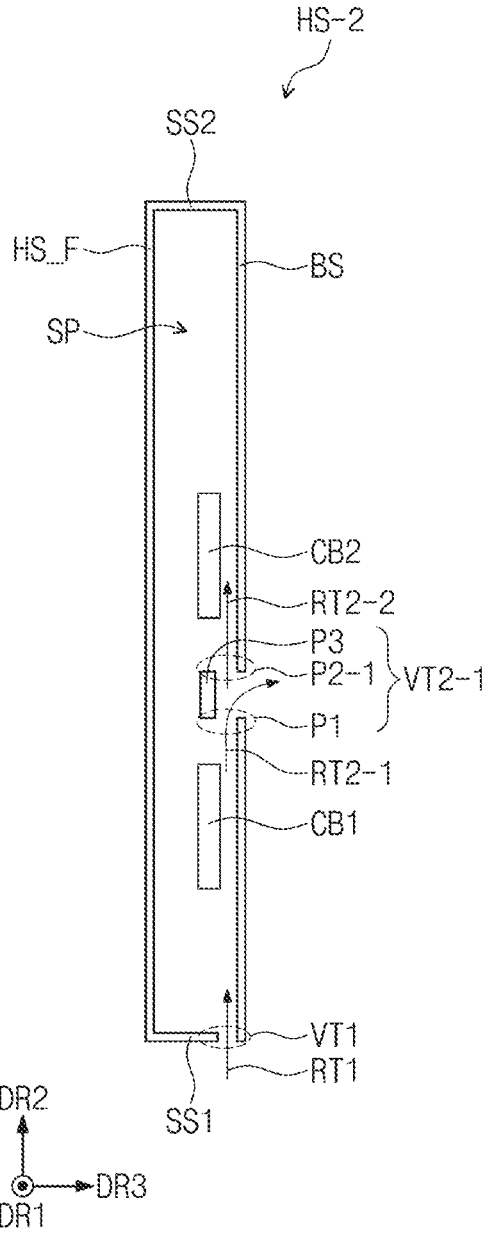

By way of example, as illustrated in FIG. 7B, a housing HS-2 may include a second opening VT2-1 having a shape different from that of the housing HS-1 illustrated in FIG. 7A. The second opening VT2-1 differs from the second opening VT2 illustrated in FIG. 7A in terms of the shape of a second part P2-1.

In detail, in the second opening VT2-1, the second part P2-1 may include a hole communicating with the outside. The second part P2-1 may have holes defined in a same manner as that of the first P1 and have a shape parallel to the first side surface SS1. By way of example, the second part P2-1 may be provided as a single large open hole.

Accordingly, the air flow generated in the second opening VT2 may include a first sub-flow RT2-1 and a second sub-flow RT2-2. The first sub-flow RT2-1 may be an air flow discharged to the outside through the first part P1. The second sub-flow RT2-2 may be an air flow introduced into the internal space SP through the second part P2. The second sub-flow RT2-2 may include at least one of a part of the first sub-flow RT2-1 and external air or may include both types of the air. The second sub-flow RT2-2 may be provided on the second circuit board CB2.

Accordingly, the amount of air introduced into the second circuit board CB2 may increase. Thus, in case that the second circuit board CB2 generates heat of which the amount is relatively high as compared to the first circuit board CB1, even in case that the air has a temperature slightly higher than that of the air introduced from the first opening VT1, the amount of the air introduced into the second circuit board CB2 may increase, and thus the heat dissipation efficiency of the second circuit board CB2 may be improved. The air heated by the circuit boards CB1 and CB2 has the third flow RT3 and is discharged through the third opening VT3, and thus the natural convection from the first opening VT1 via the second opening VT2 to the third opening VT3 may be uniformly generated in the entire area of the internal space SP. Accordingly, the electronic device having the improved heat dissipation effect may be provided.

Figure 7C:
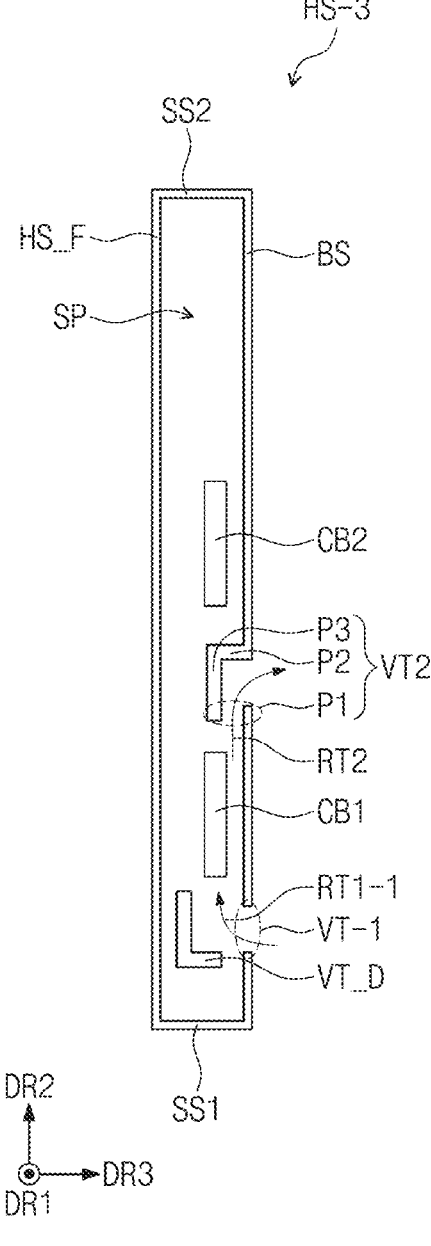

By way of example, as illustrated in FIG. 7C, unlike the housing HS-1 illustrated in FIG. 7A, a housing HS-3 may include a first opening VT-1 disposed in the rear surface part BS. The first opening VT-1 may be disposed not in the first side surface SS1 but in the rear surface part BS, thereby securing a larger width in the second direction DR2. Thus, since the first opening VT-1 having a larger area may be provided, the heat dissipation effect may be improved.

The housing HS-3 may further include an additional member VT_D. The additional member VT_D may have an "L" shape in a cross section. The additional member VT_D may make the flow of the external air introduced through the first opening VT-1 be parallel to the first direction DR1. Accordingly, a first flow RT1-1 is controlled to face the first circuit board CB1, and thus stable heat dissipation of the circuit boards CB1 and CB2 may be achieved.

In an embodiment, it is illustrated that the additional member VT_D is spaced apart from the rear surface part BS and is provided inside the internal space SP. However, this is illustrated as an example, and in the housing HS-3 according to an embodiment, the additional member VT_D may be provided by being physically connected to the rear surface part BS and is not limited to an embodiment.

Figure 7D:
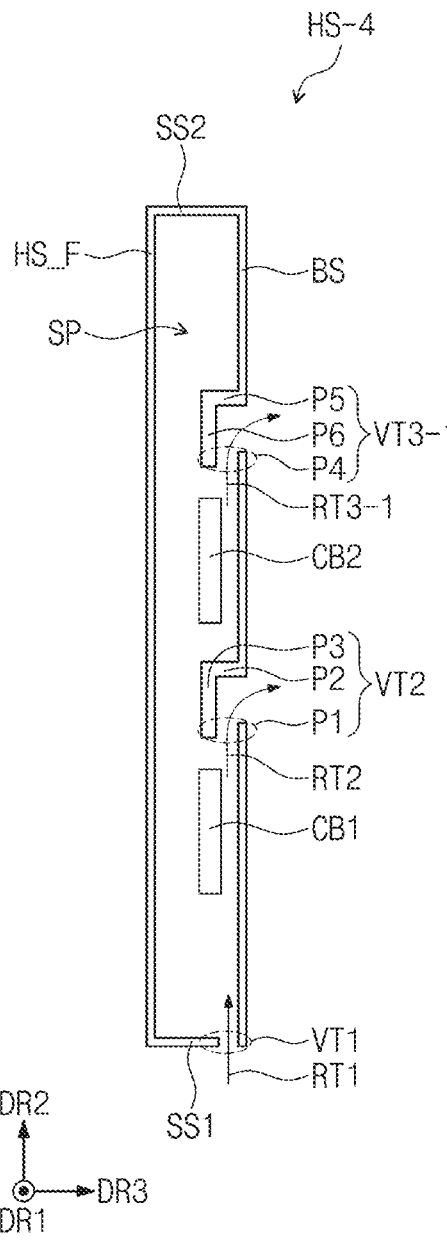

By way of example, as illustrated in FIG. 7D, unlike the housing HS-1 illustrated in FIG. 7A, a housing HS-4 may include a third opening VT3-1 disposed in the rear surface part BS. The third opening VT3-1 may be provided to have a shape corresponding to the second opening VT2. In detail, the third opening VT3-1 may include a first part P4, a second part P5, and a third part P6 respectively corresponding to the first to third parts P1, P2, and P3 of the second opening VT2. A duplicated description thereof will be omitted.

According to the disclosure, one or more opening for inflow of the air and one or more openings for outflow of the air may be provided. For example, as illustrated in FIG. 7A, the third opening VT3 for the outflow of the air may be further included, and as illustrated in FIG. 7B, the opening for the inflow of the air by deforming the second part P2-1 may be further included. By way of example, first openings VT1 and second openings VT2 may be provided. According to the disclosure, in case that one or more openings for the inflow of the air and one or more openings for the outflow of the air may be provided, the shape or location may be variously changed, and is not limited to an embodiment.

According to the disclosure, the electronic device may include the first opening VT1 for the inflow of the air and the second opening VT2 for the outflow of the air, thereby generating the natural convection in the internal space SP. Accordingly, the heat dissipation effect of an internal electronic component may be improved, and a separate heat dissipation fan may be omitted. Further, since the heat dissipation through the natural convection may be achieved, noise problems and the like may be solved, and power consumption may be reduced.

According to the disclosure, heat generated inside an electronic device may be effectively dissipated, and thus the lifetime of the electronic device may be improved.

Further, according to the disclosure, separate mechanical components for heat dissipation such as a heat dissipation fan may be omitted, and thus costs may be reduced, and noise problems may be solved.

Hereinabove, although the disclosure has been described with reference to embodiments and the accompanying drawings, the disclosure is not limited thereto, but may be variously modified and altered by those skilled in the art to which the disclosure pertains without departing from the spirit and scope of the disclosure and as claimed in the following claims.

What is claimed is:

1. An electronic device comprising:
a display panel;
a first circuit board electrically connected to the display panel;
a second circuit board electrically connected to the display panel and spaced apart from the first circuit board in a first direction; and a housing defining an internal space that accommodates the display panel, the first circuit board, and the second circuit board, wherein
the housing includes:
a rear surface part covering a rear surface of the display panel;
a first opening exposing the internal space and closer to the first circuit board than to the second circuit board; and
a second opening exposing the internal space, spaced apart from the first opening, and disposed between the first circuit board and the second circuit board,
the second opening is configured to prevent air heated by the first circuit board from reaching the second circuit board, first holes passing through the housing are included in the first opening,
the second opening is defined by the rear surface part at a location above the first opening and includes:
a first part bent from the rear surface part toward the internal space;
a second part bent from the rear surface part toward the internal space and parallel to the first part; and
a third part connected to the first part and the second part,
the first part, the second part, and the third part are formed in one body and the one body defines a shape recessed from the rear surface part when viewed from an outside of the electronic device, and
second holes passing through the housing in a parallel direction to the third part are included in the first part of the second opening above the first holes included in the first opening.

2. The electronic device of claim 1, wherein a width of the first opening in a second direction intersecting the first direction is less than or equal to a width of the second opening in the second direction.

3. The electronic device of claim 1, wherein
the housing further includes:
a first side surface extending in a second direction intersecting the first direction, connected to the rear surface part, and closer to the first circuit board than to the second circuit board;
a second side surface connected to the rear surface part, parallel to the first side surface, spaced apart from the first side surface in the first direction, and closer to the second circuit board;
a third side surface and a fourth side surface connected to the rear surface part, spaced apart from each other in the second direction intersecting the first direction, and facing each other; and
a front frame covering a front surface of the display panel,
a rear frame of the housing includes the first side, the second side, the third side, the fourth side, and the rear surface part, and
the rear frame and the front frame are coupled to each other to surround, encompass, and define the internal space.

4. The electronic device of claim 3, further comprising:
a third opening spaced apart from the second opening in the first direction,
wherein the second circuit board is disposed between the third opening and the second opening of the housing.

5. The electronic device of claim 4, wherein
the third opening is disposed in the second side surface, and
the third opening includes third holes passing through the second side surface.

6. The electronic device of claim 4, wherein the third opening is disposed in the rear surface part.

7. The electronic device of claim 1, wherein
the first holes in the first opening pass through the first side surface, and
a passing direction of each of the first holes is identical to a passing direction of each of the second holes.

8. The electronic device of claim 1, wherein
first holes in the first opening pass through the rear surface part, and
a passing direction of each of the first holes is different from a passing direction of each of the second holes.

9. The electronic device of claim 1, wherein the second part shields the internal space from the outside of the electronic device.

10. The electronic device of claim 1, wherein the second part includes a hole that exposes the internal space and the outside of the electronic device.

11. The electronic device of claim 1, wherein the first part, the second part, and the third part are a single, uninterrupted structure comprised of a same material.

12. The electronic device of claim 1, wherein heat dissipation of the second circuit board is independent of heat dissipation of the first circuit board.

13. An electronic device comprising:
a display panel;
a first circuit board electrically connected to the display panel, the first circuit board having a first width in a first direction;
a second circuit board electrically connected to the display panel, the second circuit board having a second width in the first direction, and spaced apart from the first circuit board in a second direction intersecting the first direction; and a housing that defines an internal space that accommodates the display panel, the first circuit board, and the second circuit board, wherein the housing includes a rear frame coupled to a front frame to define the internal space, the rear frame includes:

a rear surface part parallel to a plane defined by the first direction and the second direction;

a first side surface bent from the rear surface part in a third direction intersecting the first direction and the second direction;

a second side surface bent from the rear surface part in the third direction and parallel to the first side surface;

a third side surface bent from the rear surface part in the third direction and connected to the first side surface and the second side surface and formed in one body with the rear surface part;

a fourth side surface bent from the rear surface part in the third direction, spaced apart from the third side surface in the first direction, and parallel to the third side surface;

a first opening including first holes exposing the internal space and an outside of the electronic device; and a second opening spaced apart from the first opening, disposed between the first circuit board and the second circuit board, and including second holes exposing the internal space and the outside of the electronic device, the first opening and the second opening are spaced apart from each other in the second direction to provide an air flow in the internal space by natural convection from the first opening to the second opening, the second opening is configured to prevent air from the air flow heated by the first circuit board from reaching the second circuit board, the first circuit board is disposed between the first opening and the second opening, the second opening is recessed toward the internal space from the rear surface part, and each of the second holes is disposed above the first holes included in the first opening and a passing direction of the second holes parallel to the second direction and the second circuit board.

14. The electronic device of claim 13, wherein the first opening is disposed in the first side surface, and a passing direction of each of the first holes is identical to the passing direction of each of the second holes.

15. The electronic device of claim 13, wherein the first opening is disposed in the rear surface part, and a passing direction of each of the first holes is different from the passing direction of each of the second holes.

16. The electronic device of claim 13, further comprising:

a third opening including third holes passing through the second side surface.

17. The electronic device of claim 13, further comprising:

a third opening disposed in the rear surface part and spaced apart from the second opening in the second direction, wherein the second circuit board is disposed between the third opening and the second opening of the housing.

18. The electronic device of claim 13, wherein a width of the first opening in the first direction is less than or equal to the first width of the first circuit board.

19. The electronic device of claim 18, wherein a width of the second opening in the first direction is greater than or equal to the first width of the first circuit board.

20. The electronic device of claim 13, the rear frame being a single, integrated monolithic unit comprised of a same material and being a single, uninterrupted structure.

* * * * *